(12) United States Patent
Lo et al.

(10) Patent No.: US 7,474,130 B1
(45) Date of Patent: Jan. 6, 2009

(54) COMPENSATION OF VOLTAGE-TO-CURRENT CONVERTER

(75) Inventors: Ping Lo, Santa Clara, CA (US); Xuecheng Jin, Palo Alto, CA (US)

(73) Assignee: iWatt Inc., Los Gatos, CA (US)

( * ) Notice: Subject to any disclaimer, the term of this patent is extended or adjusted under 35 U.S.C. 154(b) by 43 days.

(21) Appl. No.: 11/671,810

(22) Filed: Feb. 6, 2007

(51) Int. Cl.
*H02M 11/00* (2006.01)
*H03L 7/06* (2006.01)

(52) U.S. Cl. ............... 327/103; 327/152; 327/143; 327/362

(58) Field of Classification Search ........... 327/103, 327/362, 156–157, 147–149
See application file for complete search history.

(56) References Cited

U.S. PATENT DOCUMENTS

| | | | | |
|---|---|---|---|---|
| 4,330,744 A | * | 5/1982 | Embree et al. ............ | 323/316 |
| 7,073,662 B2 | * | 7/2006 | Neely et al. ............... | 198/850 |
| 7,123,075 B2 | * | 10/2006 | Iorga ........................ | 327/530 |
| 7,123,081 B2 | * | 10/2006 | Lyon ........................ | 327/543 |
| 7,174,143 B1 | * | 2/2007 | Turvey .................... | 455/226.1 |

* cited by examiner

*Primary Examiner*—Dinh T. Le
(74) *Attorney, Agent, or Firm*—Fenwick & West LLP

(57) ABSTRACT

A voltage-to-current converter providing an output current with compensation for process-voltage-temperature (PVT) variations of a component in the voltage-to-current converter. The voltage-to-current converter includes a first voltage-to-current converter branch, a second voltage-to-current converter branch, and a compensation current path. The first voltage-to-current converter provides a first current to the output of the voltage-to-current converter based on a variable control voltage. The second voltage-to-current converter branch provides a second current based on a fixed voltage. The compensation current path provides a compensation current from the second voltage-to-current branch to the first voltage-to-current converter branch compensating variations in the first current caused by the PVT variations of the component in the first voltage-to-current converter branch.

13 Claims, 4 Drawing Sheets

COMPENSATION OF VOLTAGE-TO-CURRENT CONVERTER

BACKGROUND OF THE INVENTION

1. Field of the Invention

The present invention relates generally to a voltage-to-current converter, and more specifically, to compensating variations in an output current of a voltage-to-current converter caused by process-voltage-temperature (PVT) variations.

2. Description of the Related Art

A phase-locked loop (PLL) is a closed-loop feedback control system that generates and outputs a signal in relation to the frequency and phase of an input reference signal. A PLL responds to both the frequency and the phase of the input reference signal, automatically raising or lowering the frequency of a controlled oscillator until it matches the input reference signal in both frequency and phase.

FIG. 1 shows a schematic block diagram of a conventional PLL. A PLL generally includes a phase/frequency detector (PFD) 102, a charge pump 104, a low pass filter 106, a voltage-controlled oscillator (VCO) 112, and a feedback divider 114. The PFD 102 compares the phase of the feedback signal FFB from the feedback divider 114 with a reference signal FIN and generates an error signal. If the phase of FFB lags that of FIN, the PFD 102 causes the charge pump 104 to increase the control voltage so that the VCO 112 speeds up. Likewise, if the phase of FFB creeps ahead of that of FIN, the PFD 102 causes the charge pump 104 to lower the control voltage to slow down the VCO 112. The low pass filter 106 smoothes out the abrupt changes in control inputs from the charge pump 104.

A typical VCO 112 includes a voltage-to-current converter 108 and a current-controlled oscillator (ICO) 110. The voltage-to-current converter 108 converts a voltage signal from the low pass filter 106 to a current signal. The current signal is then provided to the ICO 110 to generate an output signal $F_{out}$.

FIG. 2 shows a circuit diagram of a conventional voltage-to-current converter 108. The voltage-to-current converter 108 includes a field effect transistor (FET) 202, an input 204, an output 206, and a resistor R. The input 204 of the voltage-to-current converter 108 is coupled to the gate of the FET 202 to receive the control voltage $V_{C1}$. The output 206 of the voltage-to-current converter 108 is coupled to the ICO 110. One end of the resistor R is coupled to the source of the FET 202 and the other end of the resistor R is grounded. The voltage-to-current converter 108 controls a current $I_{ICO1}$ from the ICO 110 based on the control voltage $V_{C1}$.

The voltage-to-current converter 108 of FIG. 2, however, does not provide compensation for process-voltage-temperature (PVT) variations in the threshold voltage of the FET 202. Accordingly, the PVT variations of the threshold voltage of the FET 202 may cause jitters in the current $I_{ICO1}$. Such jitters cause the voltage-to-current converter to be less accurate and reliable than desired. The inaccuracy and unreliability of the voltage-to-current converter in turn results in overall degraded performance of the PLL because of the jitters in the output signal $F_{out}$.

Another disadvantage of the voltage-to-current converter 108 of FIG. 2 is that the current $I_{ICO1}$ is completely cut off when the control voltage $V_{C1}$ is below the threshold voltage of the FET 202. Therefore, the ICO 110 will stop generating signals when the control voltage $V_{C1}$ falls below the threshold voltage of the FET 202. This is problematic because digital systems receiving the signals from the ICO 110 will malfunction when the signals are not received from the ICO 110. Therefore, the digital systems with the ICO 110 are more vulnerable to malfunctioning compared to the digital systems that do not use ICO 110.

Therefore, there is a need for a voltage-to-current converter that can compensate for PVT variations of the threshold voltage of the FET. There is also a need for a voltage-to-current converter that provides a minimum current to an ICO even when the control voltage is below the threshold voltage of the FET.

SUMMARY OF INVENTION

An embodiment of the present invention provides a voltage-to-current converter providing an output current with compensation for variations (e.g., process-voltage-temperature (PVT) variations) of a component (e.g., FET) in the voltage-to-current converter. The voltage-to-current converter includes a first voltage-to-current converter branch, a second voltage-to-current converter branch, and a compensation current path. The first voltage-to-current converter provides a first current to the output of the voltage-to-current converter based on a variable control voltage. The second voltage-to-current converter branch provides a second current based on a fixed voltage. The compensation current path provides a compensation current to the output of the voltage-to-current converter based on the second current. The compensation current compensates for variations in the first current caused by the variations of the component in the first voltage-to-current converter branch.

In one embodiment, the variations of the first current caused by the variations of the component correspond to variations of the second current caused by the variations of a counterpart component in the second voltage-to-current converter branch. The compensation current increases when the second current caused by the variations of the counterpart component in the second voltage-to-current converter branch decreases. The compensation current decreases when the second current caused by the variations of the counterpart component in the second voltage-to-current converter branch increases. Therefore, the output current obtained by merging the compensation current with the first current is immune or less affected by the variations of the component.

In one embodiment, the first voltage-to-current converter branch includes a first FET, a first resistor coupled to the source of the FET, and a current mirror. The current mirror includes first and second branches. The first branch of the current mirror is coupled to the drain of the FET, and the second branch of the current mirror is coupled to the output of the first voltage-to-current converter branch and the compensation current path. The second voltage-to-current converter branch includes a second FET (counterpart FET of the first FET), and a second resistor having the same resistance as the first resistor.

In one embodiment, the first and second FETs are of the same type having the same physical properties. Accordingly, the first and second FETs have substantially the same threshold voltage.

In one embodiment, the present invention provides a method of compensating the variations in the output current of a voltage-to-current converter. The method provides a first current by a first voltage-to-current converter branch based on a variable control voltage, and a second current by a second voltage-to-current converter branch based on a fixed voltage. The method further provides a compensation current using a compensation path. The compensation current increases responsive to a decrease in the second current because of variations, and the compensation current decreases responsive to an increase in the second current because of the variations. Then the first current and the compensation current are merged to provide the output current of the voltage-to-current converter.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the present invention can be readily understood by considering the following detailed description in conjunction with the accompanying drawings.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 3:
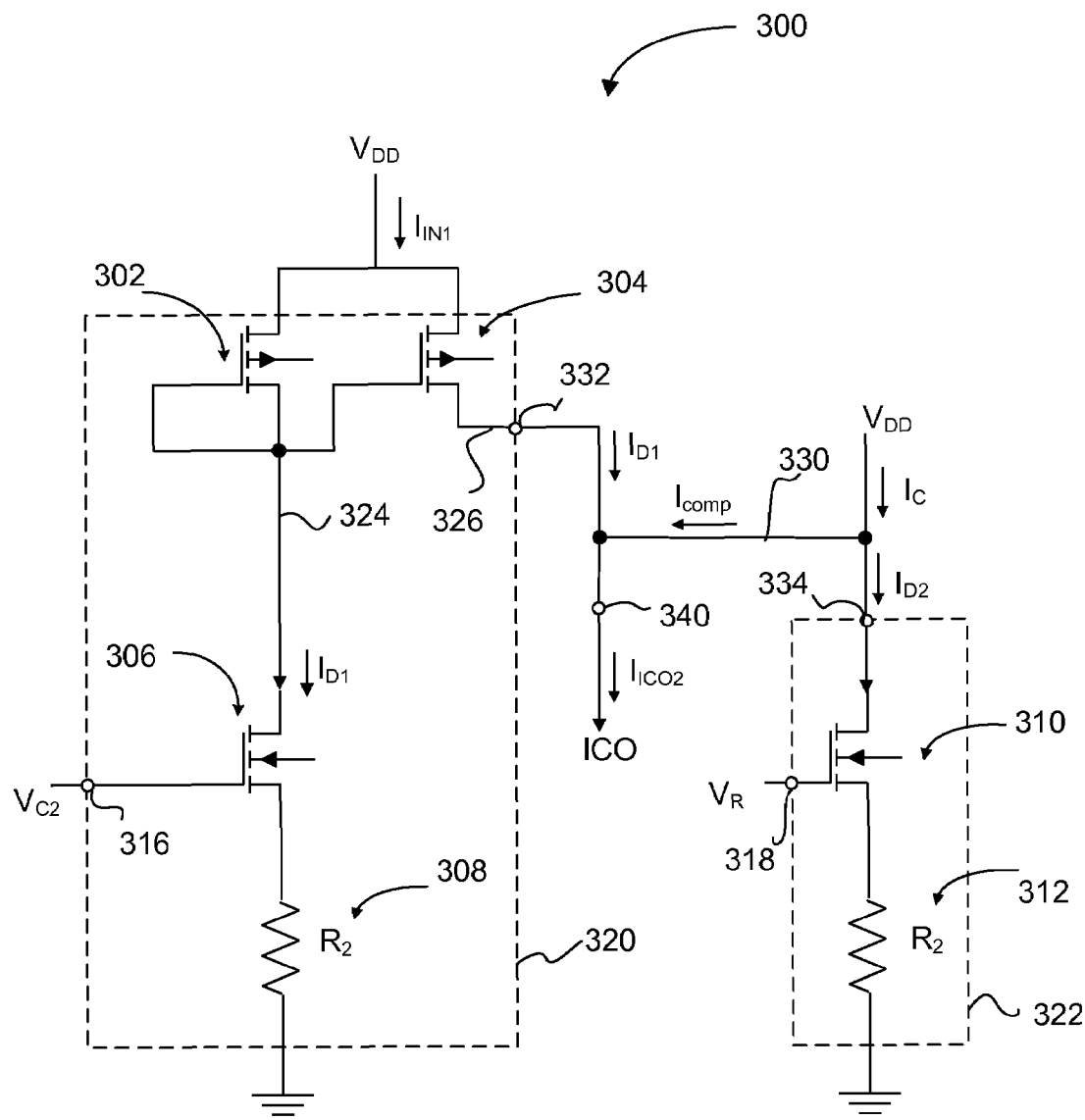
FIG. 3 is a circuit diagram of a voltage-to-current converter according to one embodiment of the present invention.

FIG. 3 is a circuit diagram of a voltage-to-current converter 300 according to one embodiment of the present invention. The voltage-to-current converter 300 includes a first voltage-to-current converter branch 320, and a second voltage-to-current converter branch 322. The input 316 of the first voltage-to-current converter branch 320 receives a variable control voltage $V_{C2}$. A current mirror matches the drain current $I_{D1}$ flowing in a first branch 324 of the current mirror with a first current $I_{D1}$ flowing in the second branch 326 of the current mirror. The drain current $I_{D1}$ of the MOSFET (Metal-Oxide-Semiconductor Field-Effect Transistor) 306 changes dynamically based on the variable control voltage $V_{C2}$. Accordingly, an output current (i.e., a first current $I_{D1}$) from the output 332 of the first voltage-to-current converter branch 320 also changes dynamically based on the variable control voltage $V_{C2}$. The first current $I_{D1}$ from the output 332 of the first voltage-to-current converter branch 320 flows to the output 340 of the voltage-to-current converter 300.

The first voltage-to-current converter branch 320 includes the current mirror 302, 304, an N-channel MOSFET 306, and a first resistor 308. The current mirror is comprised of two P-channel MOSFETs 302, 304, and has the first branch 324 and the second branch 326. The gate of the MOSFET 306 is coupled to the input 316 of the first voltage-to-current converter branch 320 for receiving the variable control voltage $V_{C2}$. The drain of the MOSFET 306 is coupled to the first branch 324 of the current mirror. The source of the MOSFET 306 is coupled to the first resistor 308. The other end of the first resistor 308 is grounded. The second branch 326 of the current mirror is coupled to the output 332 of the first voltage-to-current converter branch 330. Note that MOSFETs can readily be replaced with other types of transistors including bipolar junction transistors. Also, P-channel MOSFETs and N-channel MOSFETs are mutually interchangeable with corollary changes to the circuit arrangements that are well known in the art.

In contrast, the input 318 of the second voltage-to-current converter branch 322 receives a fixed voltage $V_R$. Therefore, the output current (i.e., a second current $I_{D2}$) flowing into the output 334 of the second voltage-to-current converter branch 322 is kept constant except for changes due to variations (e.g., process-voltage-temperature (PVT) variations) of the MOSFET 310 and the second resistor 312 of the second converter branch 322. In one embodiment, the fixed voltage $V_R$ is set to the middle of the range of the variable control voltage $V_{C2}$. As explained below, the changes in the output current $I_{D2}$ due to the PVT variations of the MOSFET 310 is used for providing a compensation current $I_{comp}$ to the output 340 of the voltage-to-current converter 322.

The second voltage-to-current converter branch 322 includes an N-channel MOSFET 310 and a second resistor 312. The gate of the MOSFET 310 is coupled to the input 318 of the second voltage-to-current converter branch 322 for receiving the fixed voltage $V_R$. The drain of the MOSFET 310 is coupled to the output 334 of the second voltage-to-current converter branch 322. The source of the MOSFET 310 is coupled to the second resistor 312. In one embodiment, the resistance $R_2$ of the second resistor 312 is the same as that of the first resistor 308. Note that the MOSFET 310 can be readily replaced with other types of transistors including bipolar junction transistors, or with P-channel MOSFET with corollary changes to the circuit that are well known in the art.

Figure 1:
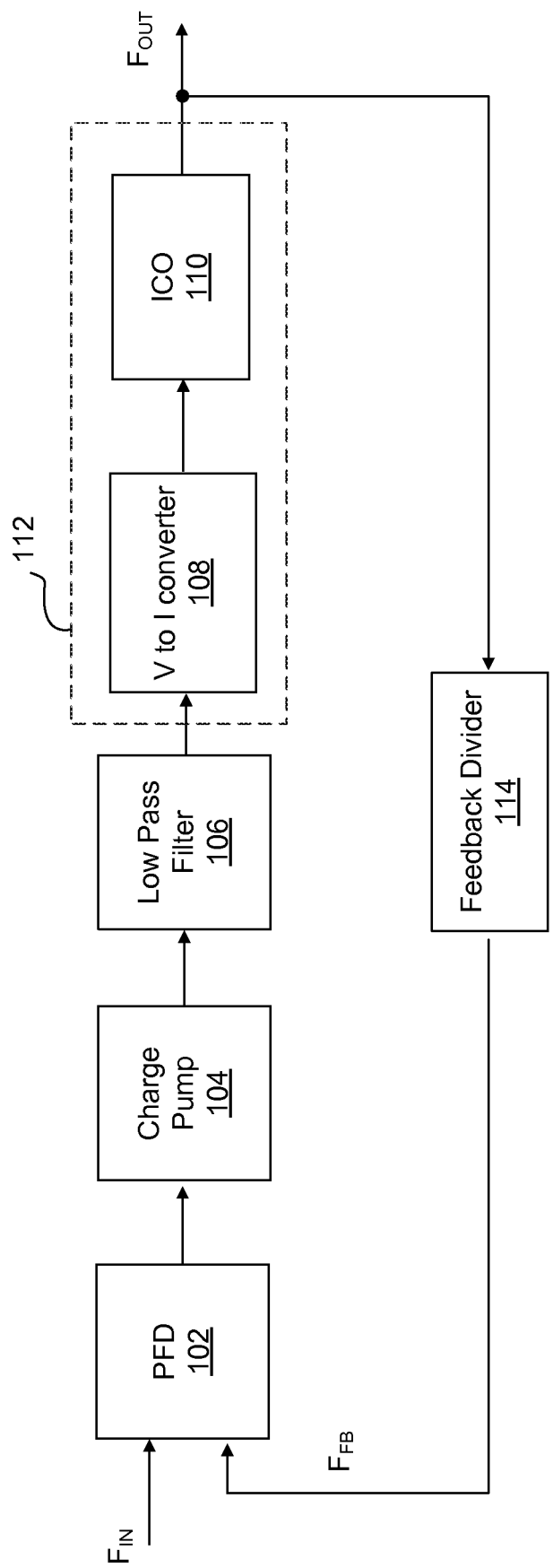
FIG. 1 is a block diagram showing a conventional phase-locked loop.
Figure 2:
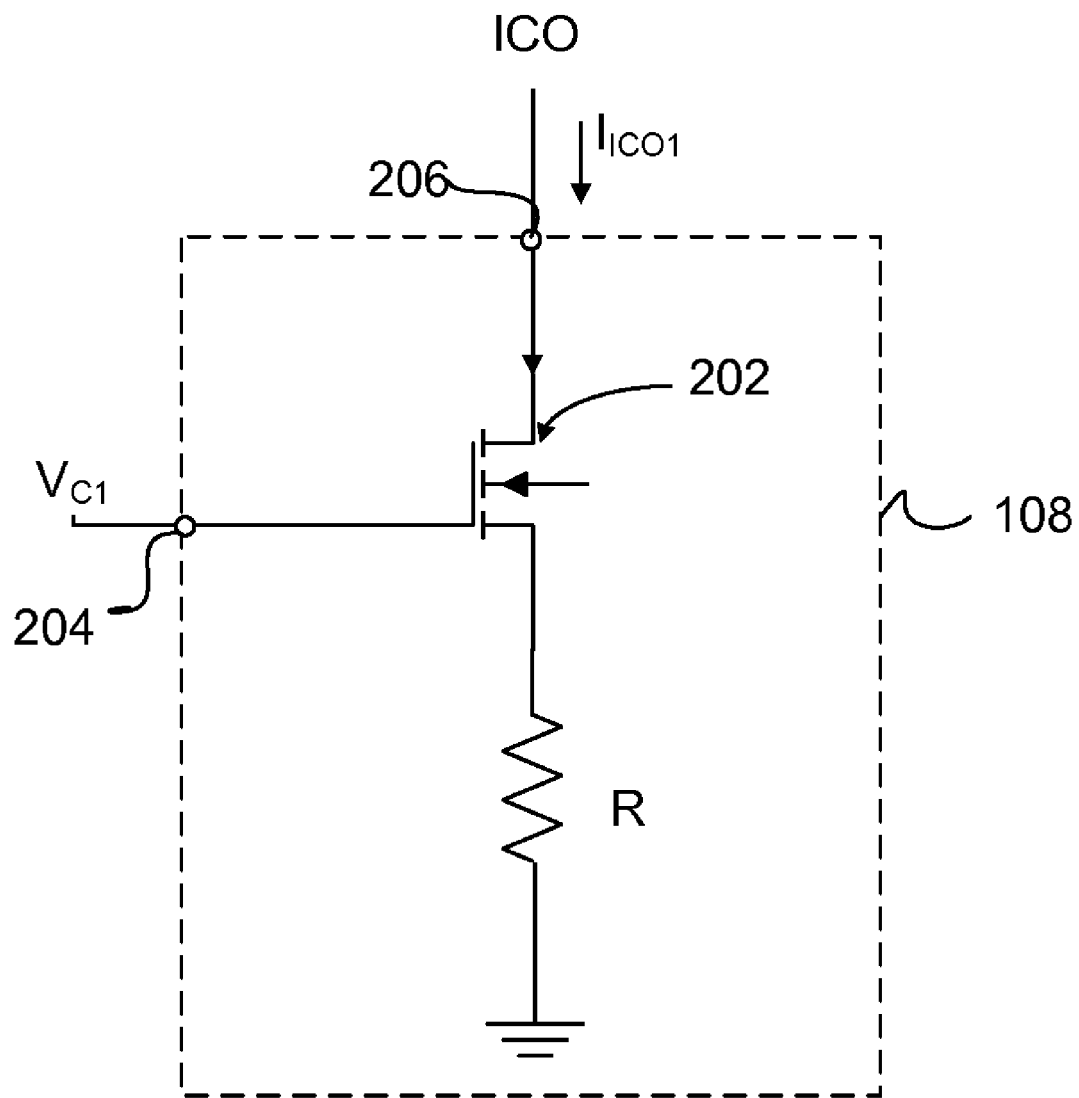
FIG. 2 is a circuit diagram of a conventional voltage-to-current converter.

The compensation path 330 is provided between the output 332 of the first voltage-to-current converter branch 320 and the output 334 of the second voltage-to-current converter branch 322. The compensation current $I_{comp}$ flows through the compensation path 330 and merges with the first current D1 from the output 332 of the first voltage-to-current converter branch 320. The merged current $I_{ICO2}$ flows from the output 340 of the voltage-to-current converter 300 to the ICO 110 (shown in FIG. 1). Thus, the variable control voltage $V_{C2}$ is the 'input' to the voltage-to-current converter 300 and the current $I_{ICO2}$ is the 'output' of the voltage-to-current converter 300.

The principle of compensating variations in the first current $I_{D1}$ due to the PVT variations in the MOSFET 306 will now be explained below. A current $I_{IN1}$ flows into the current mirror of the first voltage-to-current branch 320. The same amount of current $I_{D1}$ flows through the first and second branches 324, 326 of the current mirror (i.e., $I_{IN1}=2I_{D1}$). The current $I_{D1}$ of the first branch 324 flows from the drain to the source of the MOSFET 306. Disregarding the ignorable gate current of the MOSFET 306 for the sake of clarity, the following equation can be derived.

$$I_{D1}=(V_{C2}-V_{th1})/R_2 \quad (1)$$

(where $V_{th1}$ is a threshold voltage of the MOSFET 306).

Similarly, $I_{D2}$ of the MOSFET 310 of the second voltage-to-current converter branch 322 satisfies the following equation.

$$I_{D2}=(V_R-V_{th2})/R_2 \quad (2)$$

(where $V_{th2}$ is a threshold voltage of the MOSFET 310).

Therefore, the following relationship regarding $I_{comp}$ can be derived.

$$I_{comp}=I_C-I_{D2}=I_C-(V_R-V_{th2})/R_2 \quad (3)$$

(where $I_C$ indicates a voltage source current from a voltage source $V_{DD}$ to the second voltage-to-current converter branch 322 and the compensation path 330).

The output current $I_{D1}$ from the output 332 of the first voltage-to-current converter branch 320 merges with the compensation current $I_{comp}$ and flows to the output 340 of the voltage-to-current converter 300. Accordingly, the following equation can be derived.

$$I_{ICO2}=I_{D1}+I_{comp} \quad (4)$$

Combining equations (1) and (3) into equation (4), we obtain the following equation:

$$I_{ICO2}=I_{D1}+I_{comp}=(V_{C2}-V_{th1})/R_2+I_C-(V_R-V_{th2})/R_2 \quad (5)$$

Because the threshold voltage $V_{th1}$ of the MOSFET 306 and the threshold voltage $V_{th2}$ of the MOSFET 310 are the same, equation (5) can be reduced to the following equation:

$$I_{CO2}=(V_{C2}-V_R)/R_2+I_C \quad (6)$$

Because the threshold voltages $V_{th1}$ and $V_{th2}$ are cancelled out in equations (5) and (6), $I_{ICO2}$ does not vary in accordance with the threshold voltage $V_{th1}$ of the MOSFET 306. Therefore, the output current $I_{ICO2}$ is not affected by the PVT variations of the threshold voltage $V_{th1}$ of the MOSFET 306.

In one embodiment, the MOSFETs 306, 310 have the same physical properties to ensure that $V_{th1}$ and $V_{th2}$ are cancelled out as shown in equation (6). In another embodiment, the MOSFETS 306, 310 are manufactured on a same semiconductor chip using the same manufacturing process, and are located in proximity to each other on the semiconductor chip so $V_{th1}$ and $V_{th2}$ are matched.

Figure 4:
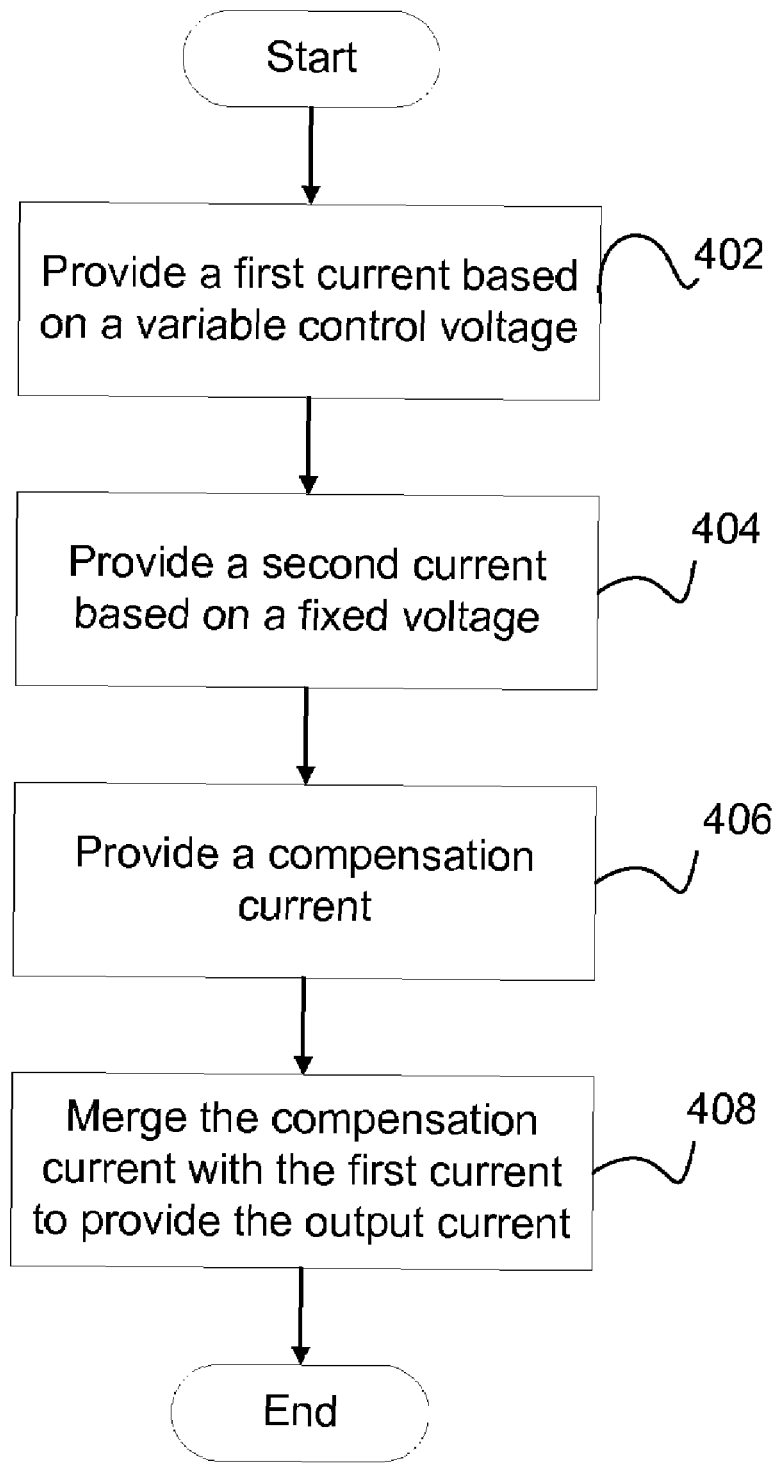
FIG. 4 is a flow chart showing a method for compensating an output current of the voltage-to-current converter according to one embodiment of the present invention.

Moreover, the output current $I_{ICO2}$ of the voltage-to-current converter is provided to the ICO 110 even when the variable control voltage $V_{C2}$ falls below the threshold voltage $V_{th1}$ of the MOSFET 306. When the variable control voltage $V_{C2}$ falls below the threshold voltage $V_{th2}$, the first current $I_{D1}$ will not flow. But, the compensation current $I_{comp}$ may still flow to the ICO 110 through the output 340 of the voltage-to-current converter 300. Providing current to the ICO 110 regardless of the drop in the variable control voltage $V_{C2}$ is advantageous because the ICO 110 will always provide an output signal. Because the phase-locked loop including the ICO 110 will always provide an output signal to a device coupled to the phase-locked loop, malfunctioning of the device coupled to the phase-locked loop is prevented A method of compensating the PVT variations in the output current $I_{ICO2}$ of a voltage-to-current converter 300 according to one embodiment is now explained with reference to FIG. 4. First, the first current $I_{D1}$ is provided 402 by a first voltage-to-current converter branch 320 based on the variable control voltage $V_{C2}$. In one embodiment, providing the first current $I_{D1}$ is achieved by controlling the drain current of the MOSFET 306 based on the variable control voltage $V_{C2}$ received at the gate of the MOSFET 306, then causing the drain current to flow in the first branch 324 of the current mirror, and then providing the first current $I_{D1}$ from the second branch 326 of the current mirror to the output 340 of the voltage-to-current converter 300.

The second current $I_{D2}$ is provided 404 from the voltage source $V_{DD}$ to the output 334 of the second voltage-to-current converter branch 322 based on the fixed voltage $V_R$. In one embodiment, providing the second current $I_{D2}$ is achieved by controlling the drain current of the MOSFET 310 based on the fixed voltage $V_R$ received at the gate of the MOSFET 310. A person skilled in the art will readily recognize that the steps 402 and 404 are performed in parallel.

The compensation current $I_{comp}$ in inverse relationship with the PVT variations of the second current $I_{D2}$ is provided 406, followed by merging 408 the first current $I_{D1}$ with the compensation current $I_{comp}$ to provide the output current $I_{ICO2}$ of the voltage-to-current converter 300. That is, the compensation current $I_{comp}$ increases when the second current $I_{D2}$ decreases because of the variations, and the compensation current $I_{comp}$ decreases when the second current $I_{D2}$ increases because of the variations. In one embodiment, providing 406 the compensation current $I_{comp}$ is achieved by providing the voltage source current $I_C$ from the voltage source $V_{DD}$ to the second voltage-to-current converter branch 322 and the compensation path 330, followed by providing the compensation current $I_{comp}$ by subtracting the second current $I_{D2}$ from the current $I_C$.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A voltage-to-current converter, the voltage-to-current converter comprising:
a first voltage-to-current converter branch including an input for receiving a variable control voltage, and an output for providing a first current based on the variable control voltage;
a second voltage-to-current converter branch including an input for receiving a fixed voltage, and an output for providing a second current based on the fixed voltage;
a compensation current path coupled between the output of the first voltage-to-current converter branch and the output of the second voltage-to-current converter branch, wherein a compensation current flows on the compensation current path, the compensation current increasing responsive to a decrease in the second current and the compensation current decreasing responsive to an increase in the second current; and
an output node for providing a third current by merging the first current with the compensation current.

2. The voltage-to-current converter of claim 1, wherein the first voltage-to-current converter branch comprises:
a first FET having a gate, a drain, and a source, the gate of the first FET coupled to the input of the first voltage-to-current converter branch for receiving the variable control voltage;
a first resistor coupled to the source of the FET; and
a current mirror including first and second branches, the first branch of the current mirror coupled to the drain of the first FET and the second branch of the current mirror coupled to the output of the first voltage-to-current converter branch and the compensation current path.

3. The voltage-to-current converter of claim 2, wherein the second voltage-to-current converter branch comprises a second FET including:
   a drain coupled to the output of the second voltage-to-current converter branch and the compensation current path;
   a gate coupled to the input of the second voltage-to-current converter branch for receiving the fixed voltage; and
   a source coupled to a second resistor having a same resistance as the first resistor.

4. The voltage-to-current converter of claim 3, wherein a threshold voltage of the first FET and a threshold voltage of the second FET are substantially same.

5. A method of compensating process-voltage-temperature variations in an output current of a voltage-to-current converter, the method comprising:
   providing a first current by a first voltage-to-current converter branch based on a variable control voltage;
   providing a second current by a second voltage-to-current converter branch based on a fixed voltage;
   providing a compensation current using a compensation path, the compensation current increasing responsive to a decrease in the second current, and the compensation current decreasing responsive to an increase in the second current; and
   merging the first current with the compensation current to provide an output current of the voltage-to-current converter.

6. The method of claim 5, wherein variations of the first current equals the variations of the second current.

7. The method of claim 5, wherein providing the first current comprises:
   controlling a drain current of a first FET based on the variable control voltage received at a gate of the first FET;
   causing the drain current to flow in a first branch of a current mirror; and
   providing the first current from a second branch of the current mirror.

8. The method of claim 5, wherein providing the second current comprises:
   controlling a drain current of a second FET based on the fixed voltage received at a gate of the second FET.

9. The method of claim 5, wherein providing the compensation current comprises:
   providing a voltage source current from a voltage source to the second voltage-to-current converter branch and the compensation path; and
   providing the compensation current by subtracting the second current from the input current to the second voltage-to-current converter branch.

10. A phase-locked loop including a voltage-to-current converter, the voltage-to-current converter comprising:
    a first voltage-to-current converter branch including an input for receiving a variable control voltage, and an output for providing a first current based on the variable control voltage;
    a second voltage-to-current converter branch including an input for receiving a fixed voltage, and an output for providing a second current based on the fixed voltage;
    a compensation current path coupled between the output of the first voltage-to-current converter branch and the output of the second voltage-to-current converter branch, wherein a compensation current flows on the compensation current path, the compensation current increasing responsive to a decrease in the second current and the compensation current decreasing responsive to an increase in the second current; and
    an output node for providing a third current by merging the first current with the compensation current.

11. The phase-locked loop of claim 10, wherein the first voltage-to-current converter branch comprises:
    a first FET having a gate, a drain, and a source, the gate of the first FET coupled to the input of the first voltage-to-current converter branch for receiving the variable control voltage;
    a first resistor coupled to the source of the FET; and
    a current mirror including first and second branches, the first branch of the current mirror coupled to the drain of the first FET and the second branch of the current mirror coupled to the output of the first voltage-to-current converter branch and the compensation current path.

12. The phase-locked loop of claim 11, wherein the second voltage-to-current converter branch comprises a second FET including:
    a drain coupled to the output of the second voltage-to-current converter branch and the compensation current path;
    a gate coupled to the input of the second voltage-to-current converter branch for receiving the fixed voltage; and
    a source coupled to a second resistor having a same resistance as the first resistor.

13. The phase-locked loop of claim 12, wherein a threshold voltage of the first FET and a threshold voltage of the second FET are substantially same.

* * * * *